United States Patent
Pokorny

(10) Patent No.: US 6,488,987 B1
(45) Date of Patent: Dec. 3, 2002

(54) APPARATUS AND METHOD FOR PROCESSING SUBSTRATES

(75) Inventor: Joachim Pokorny, Hüfingen (DE)

(73) Assignee: STEAG MicroTech GmbH (DE)

( * ) Notice: Subject to any disclaimer, the term of this patent is extended or adjusted under 35 U.S.C. 154(b) by 0 days.

(21) Appl. No.: 09/869,214

(22) PCT Filed: Nov. 18, 1999

(86) PCT No.: PCT/EP99/08861

§ 371 (c)(1),
(2), (4) Date: Jun. 22, 2001

(87) PCT Pub. No.: WO00/38219

PCT Pub. Date: Jun. 29, 2000

(30) Foreign Application Priority Data

Dec. 22, 1998 (DE) .......................... 198 59 469

(51) Int. Cl.⁷ .............................. B05D 1/00; B05D 1/18; B05C 3/00; B05C 13/00
(52) U.S. Cl. .................... 427/289; 427/372.2; 427/337; 427/352; 427/430.1; 118/58; 118/421; 118/428; 118/500
(58) Field of Search .......................... 427/372.2, 430.1, 427/289, 337, 352; 118/58, 421, 428, 500

(56) References Cited

U.S. PATENT DOCUMENTS

| 4,604,027 A | * | 8/1986 | Becker et al. ............. 414/749 |
| 5,222,310 A |   | 6/1993 | Thompson et al. |
| 5,762,745 A |   | 6/1998 | Hirose |
| 6,033,135 A | * | 3/2000 | An et al. .................... 396/611 |
| 6,091,498 A | * | 7/2000 | Hanson et al. ............. 356/375 |
| 6,136,724 A | * | 10/2000 | Hansen et al. ............. 438/745 |

FOREIGN PATENT DOCUMENTS

| DE | 196 52 526 A1 | 1/1998 |
| EP | 0 821 395 A2 | 1/1998 |
| JP | 6-163505 A | 9/1994 |
| JP | 10-4079 | 1/1998 |
| JP | 10242106 A | 9/1998 |

* cited by examiner

Primary Examiner—Michael Barr
(74) Attorney, Agent, or Firm—R W Becker & Associates; R W Becker

(57) ABSTRACT

An apparatus and method for processing substrates are provided. The apparatus includes a first processing unit and a second processing unit. A substrate holder is vertically displaceable over the first processing unit, and is guided outside the first and second processing units. In a raised position of the substrate holder relative to the first processing unit, the second processing unit is movable between the substrate holder and the first processing unit.

20 Claims, 5 Drawing Sheets

APPARATUS AND METHOD FOR PROCESSING SUBSTRATES

BACKGROUND OF THE INVENTION

The present invention relates to a device for processing substrates, in particular semiconductor wafers, with a first processing unit and a substrate holder that is vertically movable above the first processing unit, and furthermore relates to a method for processing substrates, in particular semiconductor wafers, in which a substrate holder carrying a substrate is moved into a processing position above a first processing unit, a first substrate processing is performed, and the substrate holder is raised vertically after the first substrate processing.

Apparatus and methods of this type are known, for instance, from U.S. Pat. No. 5,222,310, which has a processing bowl and a cover arranged vertically movable thereabove, which cover is embodied as a substrate holder. In the known apparatus and method, a wafer carried by the cover is introduced into the processing bowl, processed, and after the processing and subsequent raising of the cover, is removed from the cover by a substrate handling apparatus. Thus, in this apparatus it is necessary to use the substrate handling apparatus to move the wafer to an additional processing unit for a subsequent wafer processing and to use another substrate holder if one is required.

Each time the substrate is handled, however, there is a risk that it will be damaged. In addition, as a rule there is limited space available for the handling units. Furthermore, providing two independent processing units requires a large amount of space. Finally, the substrate must frequently be transported when wet, which can lead to a higher incidence of contamination problems.

Known from JP-10-4079 A is another apparatus for processing substrates. In this apparatus, a substrate to be processed is placed on a substrate holder located thereunder, which substrate holder can be moved vertically via a shaft below it. The shaft extends through the bottom of a first processing device and positions the substrate holder in the first processing device in a first step. Then the substrate holder and the substrate are raised vertically out of the first processing apparatus and a second, two-part processing device is moved from the side around the substrate holder so that a second processing apparatus is formed above the first processing apparatus. The second processing device must be sealed in the area of the shaft and in the area of the interface of the two parts of the processing device, which substantially complicates the movement control for these parts and substantially increases the costs associated therewith.

Known from DE 196 526 A are an apparatus and a method for processing substrates in a fluid container, whereby a cover for receiving the substrates can be positioned above the fluid container. The cover has a device that guides and holds the substrate, which ensures that the substrate is transported safely within the cover.

Known from JP 6-163 505 A is a semiconductor substrate cleaning apparatus in which a plurality of fixed chambers are arranged vertically one above the other and which can be sequentially fitted with substrates.

JP 10-242 106 A suggests an apparatus in which a bowl receiving a substrate can be moved along a track and can be connected to various processing fluid connections in order to perform various processing procedures within the same bowl.

Starting with the state of the art as stated in the foregoing, in particular JP-10-4079 A, the object of the present invention is therefore to provide an apparatus that reduces the handling steps between various substrate processing procedures in a simple and economical manner and that eliminates sealing problems between multi-part processing devices.

SUMMARY OF THE INVENTION

Starting with the apparatus known from JP-10-4079 A, this object is achieved in that the substrate holder is guided outside of the first and second processing units, and the second processing unit is a single or unitary part. This simplifies the structure of the processing units, since the guiding does not extend through the processing bowls and thus it is not necessary to have a seal on the shaft of the substrate holder. Furthermore, because the processing device is one, i.e. a unitary, part the sealing problems are eliminated in the area of the interface between different parts of a processing unit. The apparatus is thus simpler and more cost-effective in terms of structure. In addition, media contamination due to media adhering to the shaft is prevented.

In accordance with one embodiment of the present invention, the second processing unit can be moved in a straight line, while in another embodiment it pivots.

Advantageously, the second processing unit has a rinsing apparatus. Substrates, especially semiconductor wafers, must be rinsed frequently during a manufacturing process comprising a plurality of steps, and must especially be rinsed after certain processing steps, so that a rinsing apparatus is useful as a second processing unit above a first processing unit. In accordance with another preferred embodiment of the present invention, the second processing unit has a drying apparatus. Given a preceding wet processing procedure, it is particularly important that the substrate that has been processed is dried in a controlled manner as rapidly as possible in a drying apparatus, that is, without it first having to be transported by a handling apparatus. It is particularly advantageous when the second processing unit includes a combined rinse/dry apparatus.

In another embodiment of the present invention, one part of the substrate holder can be placed on the second processing unit. When the substrate holder comprises two parts, placing a part of the substrate holder on the second processing unit makes it possible to set down one of the parts while the other is raised in order to provide access to the substrate.

In another particularly preferred embodiment of the invention, at least one additional, third processing unit and one second substrate holder that is vertically moveable above the third processing unit are provided, whereby the second processing unit is movable in a raised position of the second substrate holder between the second substrate holder and the third processing unit. By providing a third processing unit, the movable second processing unit can be alternately used for the first and third processing unit, so that additional space savings can be achieved since the second processing unit is used with two other processing units. In addition, this results in cost savings since the need for one of the processing units is obviated.

In accordance with another embodiment of the present invention, it is also possible to provide more than two processing units, for example, arranged in a circle, which units are operated similarly one after the other by a common processing unit that is located, for instance, in the center of the other processing unit.

In order to prevent the processing procedures of the first and third processing units from affecting one another due to the mutual use of the second substrate holder, in that, for instance, contaminants from one processing unit are conveyed to the other, the first and third processing units are essentially identical. The first and third processing units can also be different when there is no risk of contamination due to the mutual use of the second processing unit.

Advantageously, the second processing unit can be moved to a rest position between the first and third processing units, in which rest position the second processing unit does not perform any processing and also does not affect or overlap the first or third processing unit. The rest position need not necessarily be situated between the first and third processing unit. It is also possible to move the second processing unit into any position in which it does not affect or overlap the first or third processing unit.

In accordance with a particularly preferred embodiment of the present invention, the first processing unit is a metal plating unit. A handling apparatus for loading and unloading the substrate holder is advantageously provided.

The object of the present invention is achieved in a method for processing substrates, in particular semiconductor wafers, that has the following method steps: moving a substrate holder carrying a substrate to a processing position above a first processing unit; performing a first substrate processing; raising the substrate holder after the first substrate processing; moving a second processing unit between the raised substrate holder and the first processing unit; and performing a second substrate processing realized in that the substrate holder is guided outside of the first and second processing units and the second processing unit is a single part. This method results in the same advantages that were enumerated in the foregoing with respect to the apparatus. Preferred embodiments of the inventive method result from the subordinate claims, again resulting in the advantages enumerated in the foregoing with respect to the apparatus.

BRIEF DESCRIPTION OF THE DRAWINGS

The invention is explained in the following using a preferred exemplary embodiment with reference to the figures, in which.

DESCRIPTION OF PREFERRED EMBODIMENTS

Figure 1:
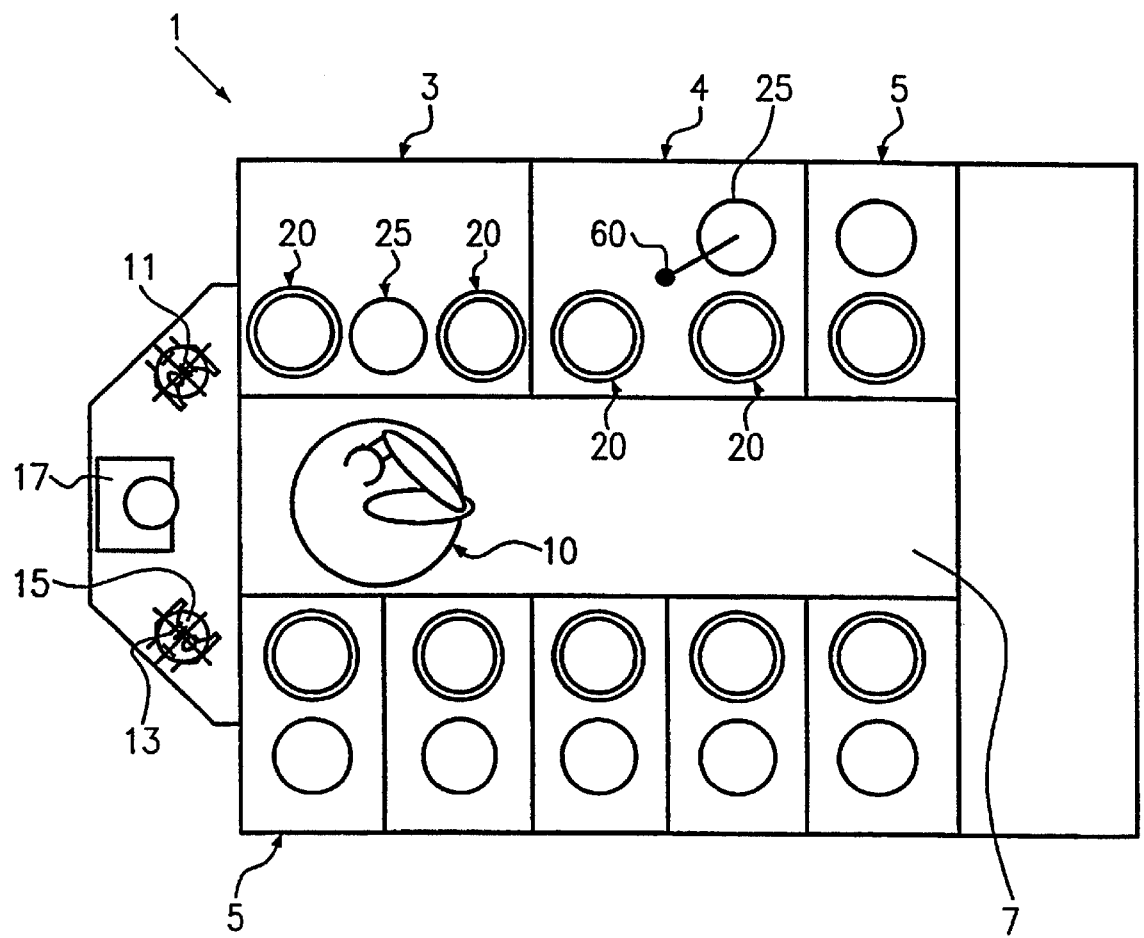
FIG. 1 is a schematic top view of a wafer processing station with a plurality of processing apparatus.

FIG. 1 is a top view of a processing station 1 with differently configured processing apparatus 3, 4, and 5. The representation of differently configured processing apparatus in one processing station is only an example that illustrates the preferred configuration options for the inventive processing apparatus. As a rule, only one configuration of the processing apparatus is used in a processing station 1.

The processing apparatus 3, 4, and 5 are arranged in two rows with an open space 7 located therebetween, in which open space a wafer-handling robot 10 is movably arranged. One wafer cassette 11, 13 is provided at one end of the wafer processing station 1 for each of the two rows of wafer processing apparatus 3, 4, 5, from which cassettes the wafer-handling robot 10 removes wafers 15 and places them into the substrate holder of the processing apparatus 3, 4, 5 or, conversely, removes wafers 15 from the substrate holder and places them into the cassettes 11 or 13. Provided between the wafer cassettes 11 and 13 is a wafer orientation unit 17 upon which a wafer 15 that has been removed from a cassette 11 or 13 is first placed in order to achieve precise orientation.

Figure 2:
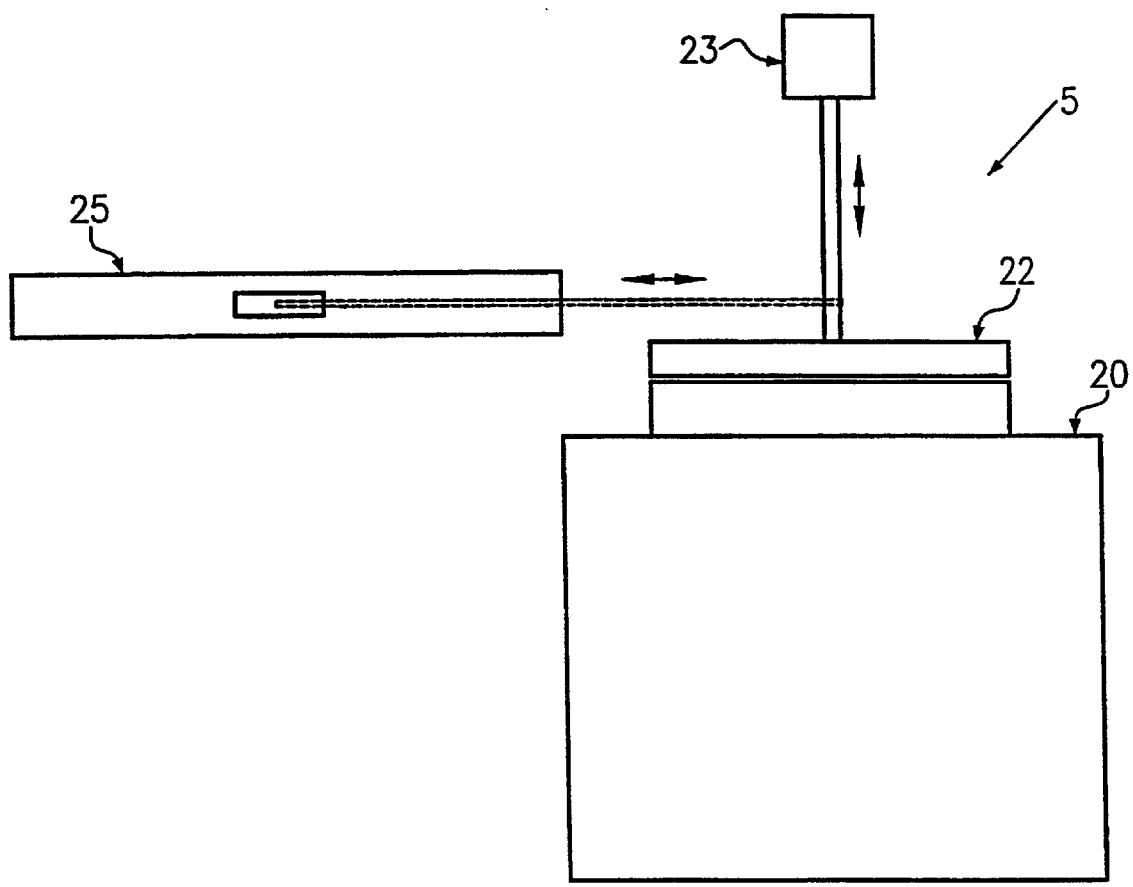
FIG. 2 is a schematic side elevation of a processing apparatus in a first processing position.
Figure 3:
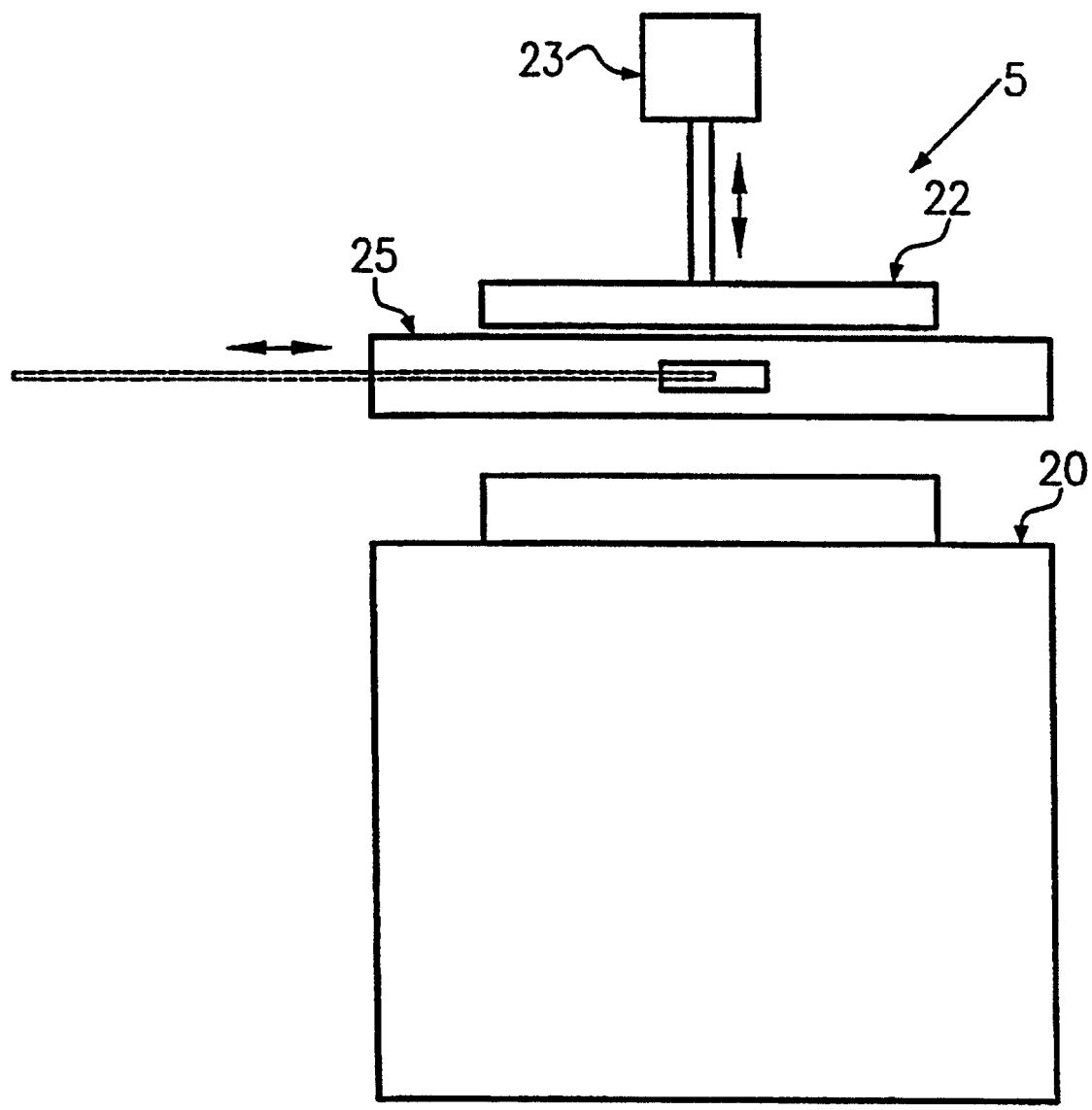
FIG. 3 is a schematic side elevation of the processing apparatus in a second processing position.

FIGS. 2 and 3 are side elevations of the wafer processing apparatus 5 that illustrate the extremely simple structure of the inventive processing apparatus. The wafer processing apparatus 5 has a metal plating apparatus 20, a substrate holder 22 that is vertically movable by means of a lift apparatus 23, and a rinse/dry apparatus 25 that is horizontally movable. The metal plating apparatus 20, the substrate holder 22, and the rinse/dry apparatus 25 are described in more detail in the following with reference to FIGS. 4 and 5.

As can be seen in FIG. 2, the substrate holder 22 can be lowered into a position located above the metal plating apparatus 20 (see also FIG. 4) in which position a metal plating process is conducted. After the metal plating process has concluded, the substrate holder 22 is raised and the rinse/dry apparatus 25 is moved to a position between the substrate holder 22 and the metal plating apparatus. Then the substrate holder 22 is lowered into a position in which a substrate located in the substrate holder is rinsed and dried (see FIG. 5). Then the lower part 41 of the substrate holder 22 is set down upon the rinse/dry apparatus 25 so that the wafer can be removed using the wafer-handling robot 10. A new wafer replaces the wafer that has been removed; the substrate holder is closed and raised. The rinse/dry apparatus is moved out of the area of the substrate holder 22 and the substrate holder then lowers the new wafer into the metal plating apparatus 20 for processing.

Figure 4:
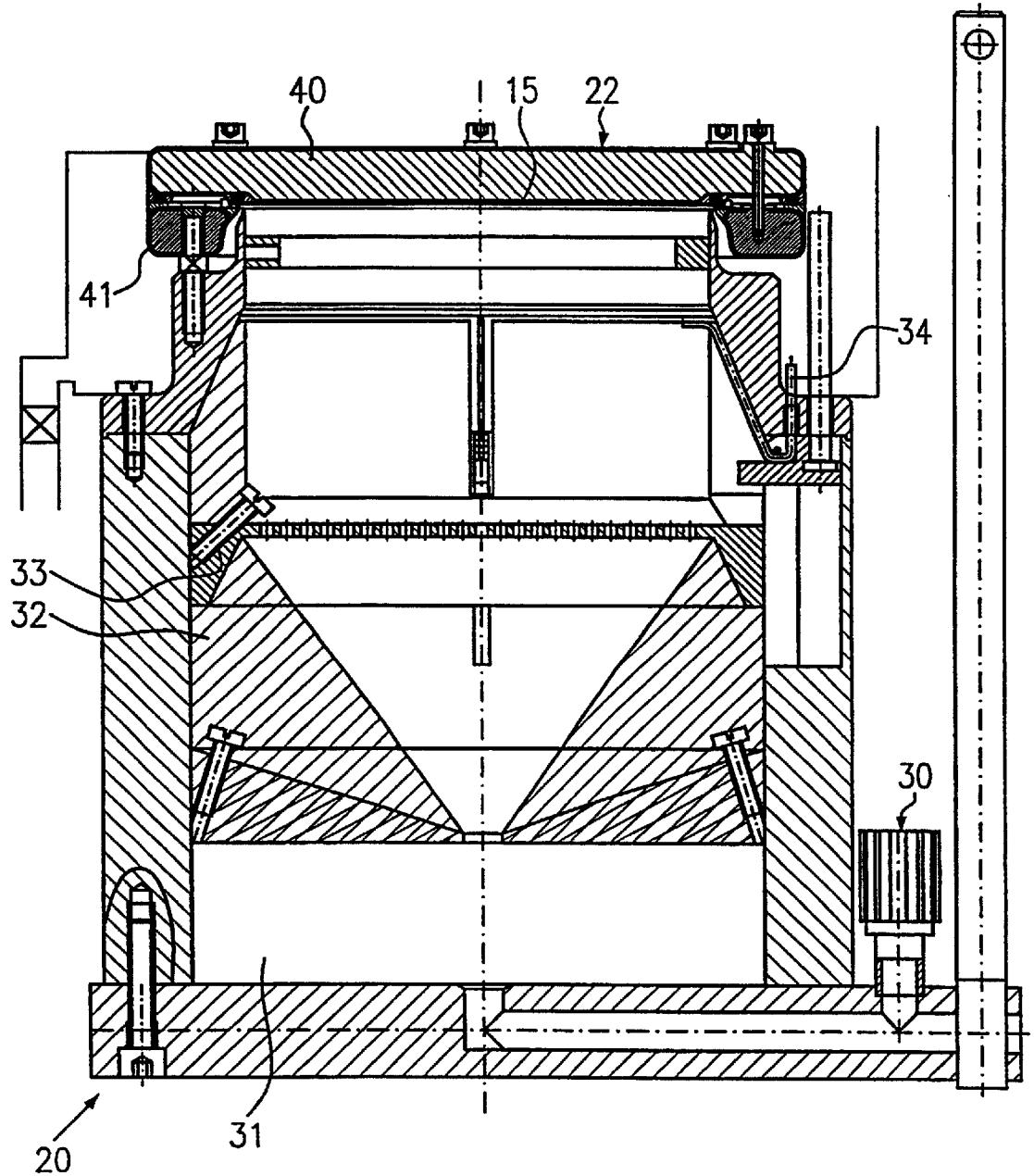
FIG. 4 is a sectional view of a first processing station with a substrate holder located thereabove.

FIG. 4 is a schematic section of the metal plating apparatus 20, whereby no housing is illustrated for the apparatus in order to simplify the drawing. A processing fluid containing an appropriate metal, for instance copper, is conducted via a connection 30 into a first chamber 31 of the processing apparatus. Arranged above the chamber is a funnel 32 that opens upward and the flow of which communicates with the chamber 31, so that media flowing through the funnel can flow upward. Arranged above the funnel is a perforated plate 33 that homogenizes the flow of processing fluid that is directed upward. An anode arrangement 34 is provided above the perforated plate 33 at a distance therefrom.

In order to avoid repetition, for additional details on the metal plating apparatus 20 please refer to the patent application with application No. 198 59 470, entitled "Apparatus and Method for Processing Substrates", which application was filed on the same day by the applicant for the present invention and which application in this regard is incorporated by reference into the present invention.

Figure 5:
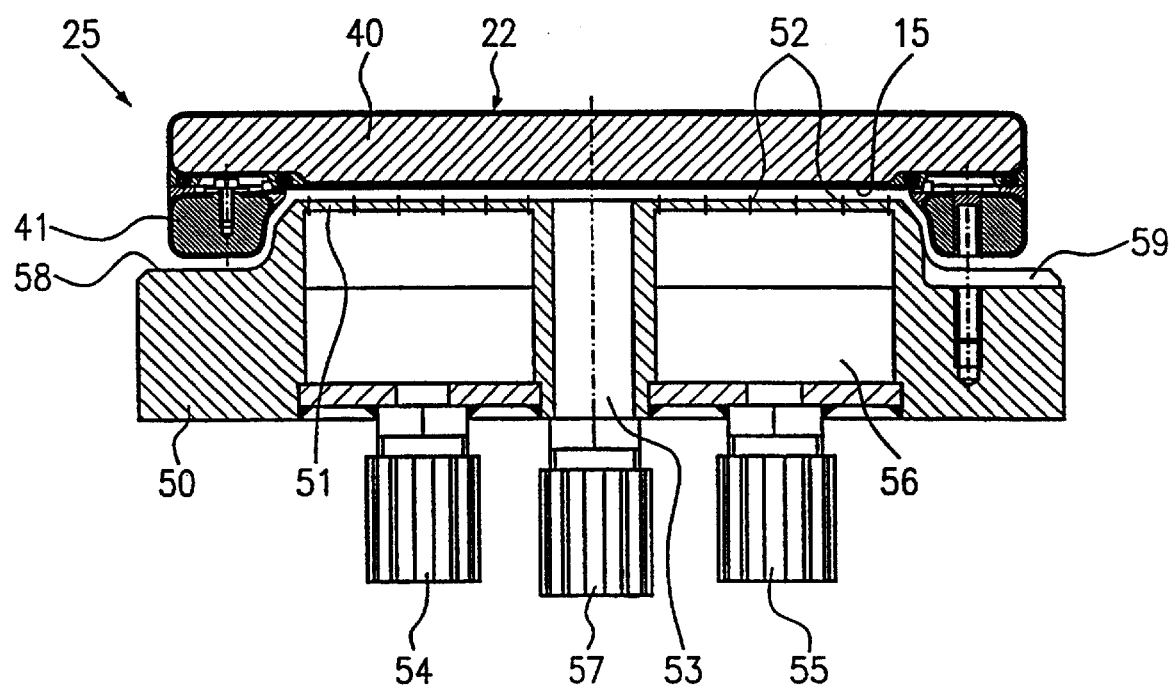
FIG. 5 is a schematic sectional view of a second processing unit with a substrate holder located thereabove.

As can be seen from FIGS. 4 and 5, located above the metal plating apparatus 20 is a substrate holder 22 that comprises an upper part 40 and an annular lower part 41, or a lower part 41 that is adapted to the shape of the substrate, between which parts a wafer 15 is placed. The upper part 40 and the lower part 41 are held together via a vacuum applied therebetween.

In order to avoid repetition, for further information on the substrate holder 22, please refer to the patent application with application No. 198 59 467, entitled "Substrate Holder", which application was filed on the same day by the applicant for the present invention and which application in this regard is incorporated by reference into the present invention.

FIG. 5 is a schematic section of the rinse/dry apparatus 25, whereby in order to simplify the drawing certain parts have been omitted, such as, for example, an external bowl for the apparatus. The rinse/dry apparatus includes a nozzle body 50 with a raised nozzle plate 51 in which are arranged a plurality of nozzles 52. Provided in the center of the nozzle plate 51 is an opening into which is placed an insert 53 with a nozzle (not shown in more detail) separated from the nozzles 52 of the nozzle plate. A fluid is conducted through fluid inlets 54 and 55 through a chamber 56 located below the nozzle plate 51, which fluid exits via the nozzles 52 and is directed at a substrate 15 located thereabove. The nozzle located in the insert 53 is actuated by a rinse fluid for rinsing the substrate 15 via an inlet 57. The fluid conducted via the inlets 54, 55 generally differs from the rinse fluid that is conducted via the inlet 57.

As can further be seen from FIG. 5, the rinse/dry apparatus 25 has a surface 58 that annularly surrounds the nozzle plate 51 and that lies deeper than the nozzle plate 51 and that has a plurality of protrusions 59, of which one can be seen in FIG. 5. The elevated protrusions 59 act as placement surfaces for the lower part 41 of the substrate holder 22 while the substrate holder 22 is being loaded and unloaded.

The substrate holder 22 is loaded and unloaded in that the lower part 41 of the substrate holder 22 is set down on the protrusions 59, the vacuum acting between the upper part 40 and the lower part 41 is released, and the upper part 40 is raised so that the wafer 15 now lies free on the lower part 41 and can be gripped by the wafer-handling robot 10 or can be inserted thereby into the opening thus created.

In order to avoid repetition, for additional details on the structure and function of the rinse/dry apparatus 25, please refer to the patent application *p+22X with application number 198 59 466, entitled "Apparatus and Method for Processing Substrates", which application was filed on the same day by the applicant for the present invention and which application in this regard incorporated by reference into the present invention.

The processing apparatus 3 illustrated in FIG. 1 differs from the processing apparatus 5 described in the foregoing in that the rinse/dry apparatus 25 is longitudinally displaceable between two metal plating apparatus 20 so that the rinse/dry apparatus 25 can be used for both metal plating apparatus. Not only does this save space, it also obviates the need for another rinse/dry apparatus 25. As can be seen in FIG. 1, in the processing apparatus 3 the rinse/dry apparatus 25 can be placed between two metal plating apparatus 20. However, it is also conceivable that there would not be sufficient room for the rinse/dry apparatus between the metal plating apparatus 20 so that the rinse/dry apparatus is arranged alternately above the one and the other of the two metal plating apparatus 20, that is, it is located between the current metal plating apparatus 20 and the substrate holder 22, whereby additional space is saved.

In the processing apparatus 4 in accordance with FIG. 1, the rinse/dry apparatus 25 is arranged such that it can pivot about an axis 60. The rinse/dry apparatus can be pivoted over one of the two metal plating apparatus 20. Alternatively, the rinse/dry apparatus can be pivoted out of the region of the metal plating apparatus 20 so that it does not overlap either of the two apparatus 20, as shown in FIG. 1, for instance.

The present invention was described with reference to preferred exemplary embodiments of the invention without limiting the invention to these special exemplary embodiments. In particular, the processing apparatus can differ in terms of structure and can be used for different processes. For instance, instead of the metal plating apparatus, a rinse unit, a chemical processing apparatus, or the like can be provided. In addition, the second, horizontally movable processing device is not limited to a rinse/dry apparatus. For instance, a drying unit alone or a polishing unit could be provided instead. It is also possible to embody or arrange the processing units such that the wafer processing occurs from above and/or from the side rather than just from below. The processing apparatus can also be used to process substrates other than semiconductor wafers, such as glass substrates, CDs, or DVDs, for instance.

The specification incorporates by reference the disclosure of German priority documents 198 59 469.0 of Dec. 22, 1998 and PCT/EP99/08861 of Nov. 18, 1999.

The present invention is, of course, in no way restricted to the specific disclosure of the specification and drawings, but also encompasses any modifications within the scope of the appended claims.

What I claim is:

1. An apparatus for processing substrates, comprising:
   a first processing unit;
   a second processing unit that is a unitary component; and
   a substrate holder that is vertically displaceable over said first processing unit, and is guided outside of said first and second processing units, wherein in a position where said substrate holder is raised relative to said first processing unit, said second processing unit is movable between said substrate holder and said first processing unit.

2. An apparatus according to claim 1, wherein said second processing unit is moveable linearly.

3. An apparatus according to claim 1, said second processing unit is pivotable.

4. An apparatus according to claim 1, wherein said second processing unit is provided with a rinse apparatus.

5. An apparatus according to claim 1, wherein said second processing unit is provided with a drying apparatus.

6. An apparatus according to claim 1, wherein a portion of said substrate holder is adapted to be set down upon said second processing unit.

7. A apparatus according to claim 1, further comprising:
   a third processing unit; and
   a second substrate holder that is vertically displaceable over said third processing unit, wherein in a position where said second substrate holder is raised relative to said third processing unit, said second processing unit is movable between said second substrate holder and said third processing unit.

8. An apparatus according to claim 7, wherein said first and third processing units are essentially identical.

9. An apparatus according to claim 7, wherein said first and third processing units differ from one another.

10. An apparatus according to claim 7, wherein said second processing unit is moveable into a rest position that is situated between said first and third processing units.

11. An apparatus according to claim 7, wherein at least said first processing unit is a metal plating unit.

12. An apparatus according to claim 1, wherein a handling apparatus is provided for loading and unloading said substrate holder.

13. A method of processing substrates, said method including the steps of:
   providing a first processing unit and a second processing unit, wherein said second processing unit is a unitary component;

moving a substrate holder that carries a substrate into a processing position over said first processing unit, wherein said substrate holder is guided outside of said first and second processing units;

carrying out a first substrate processing;

after said first substrate processing, raising said substrate holder;

moving said second processing unit between said raised substrate holder and said first processing unit; and carrying out a second substrate processing.

14. A method according to claim 13, wherein said second processing unit is moved linearly between said raised substrate holder and said first processing unit.

15. A method according to claim 13, wherein said second processing unit is pivoted between said raised substrate holder and said first processing unit.

16. A method according to claim 13, wherein a metal plating is carried out with said first substrate processing.

17. A method according to claim 13, wherein a chemical processing is carried out with said first substrate processing.

18. A method according to claim 13, wherein a rinsing of said substrate is performed with said second substrate processing.

19. A method according to claim 13, wherein a drying of said substrate is carried out with said second substrate processing.

20. A method according to claim 13, wherein at least a portion of said substrate holder is set down upon said second processing unit for loading and unloading the substrates.

* * * * *